United States Patent
Liu et al.

(10) Patent No.: US 10,928,439 B2
(45) Date of Patent: Feb. 23, 2021

(54) THERMAL GRADIENT CORRECTION OF A CURRENT MONITOR SIGNAL

(71) Applicant: SEMICONDUCTOR COMPONENTS INDUSTRIES, LLC, Phoenix, AZ (US)

(72) Inventors: Zhiwei Liu, Fremont, CA (US); Marc Dagan, Mountain View, CA (US); Kaiwei Yao, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 134 days.

(21) Appl. No.: 16/150,891

(22) Filed: Oct. 3, 2018

(65) Prior Publication Data
US 2020/0110128 A1 Apr. 9, 2020

(51) Int. Cl.
*G01R 31/26* (2020.01)
*G01R 19/00* (2006.01)
*H03K 17/687* (2006.01)
*H03K 3/011* (2006.01)

(52) U.S. Cl.
CPC ..... *G01R 31/2628* (2013.01); *G01R 19/0092* (2013.01); *H03K 3/011* (2013.01); *H03K 17/687* (2013.01)

(58) Field of Classification Search
CPC ............ G01R 31/2628; G01R 19/0092; H03K 3/011; H03K 17/687
See application file for complete search history.

(56) References Cited

U.S. PATENT DOCUMENTS

| 6,462,410 B1 | 10/2002 | Novotny et al. |
| 2016/0055901 A1* | 2/2016 | Shoemaker ............... G01K 3/08 365/222 |
| 2017/0115329 A1* | 4/2017 | Schuellein ........... G01R 15/205 |
| 2017/0115725 A1* | 4/2017 | Luo ....................... G06F 1/3296 |

* cited by examiner

*Primary Examiner* — Tung X Nguyen
*Assistant Examiner* — Feba Pothen
(74) *Attorney, Agent, or Firm* — Brake Hughes Bellermann LLP

(57) ABSTRACT

The present disclosure describes a power stage. The power stage includes a metal-oxide semiconductor field-effect transistor (MOSFET) and a driver IC coupled to the MOSFET. The driver IC is configured to switch the MOSFET to an ON-state so that MOSFET conducts a current. The driver IC includes a current monitor circuit that outputs a current monitor signal, which corresponds to the current through the MOSFET when it is in the ON-state. The current monitor signal includes an error caused by a temperature difference between the MOSFET and the driver IC. As a result, the driver IC further includes a compensation circuit that is configured to determine a thermal gradient across the driver IC, and based on the thermal gradient, adjust the current monitor circuit to reduce the error.

20 Claims, 8 Drawing Sheets

THERMAL GRADIENT CORRECTION OF A CURRENT MONITOR SIGNAL

FIELD OF THE DISCLOSURE

The present disclosure relates to power electronics and more specifically to a method and circuit to compensate for errors in a current monitor signal caused by a temperature difference between a semiconductor device and a circuit for generating the current monitor signal.

BACKGROUND

Modern server and telecom systems may require power provided by a power stage that can efficiently operate at a high power density and at a high switching frequency. The elements of the power stage can be integrated, each on a separate die, within a package to accommodate size constraints of the systems. The power stage may output a current monitor signal that represents an output current of the power stage to provide a convenient means to monitor the load conditions on the power stage. In order to make adjustments based on the monitored load conditions, the current monitor signal should be accurate. Thus, new circuits and techniques are needed to ensure the accuracy of the current monitor signal.

SUMMARY

Accordingly, in one aspect, the present disclosure describes a power stage. The power stage includes a metal-oxide semiconductor field-effect transistor (MOSFET) and a driver IC coupled to the MOSFET. The driver IC is configured to switch the MOSFET to an ON-state so that MOSFET conducts a current. The driver IC includes a current monitor circuit that outputs a current monitor signal, which corresponds to the current through the MOSFET when it is in the ON-state. The current monitor signal includes an error caused by a temperature difference between the MOSFET and the driver IC. As a result, the driver IC further includes a compensation circuit that is configured to determine a thermal gradient across the driver IC, and based on the thermal gradient, adjust the current monitor circuit to reduce the error.

In another aspect, the present disclosure describes a switch-mode power converter system. The switch-mode power converter system includes a high-side MOSFET (i.e., HS-FET), a low-side MOSFET (i.e., LS-FET), and a driver IC. The driver IC is configured to drive the HS-FET and the LS-FET to alternatively conduct an output current. The driver IC is further configured to determine a thermal gradient across the driver IC and to output a current monitoring signal that represents the output current and that depends on the thermal gradient across the driver IC. The HS-FET, the LS-FET, and the driver IC are contained in a package.

In another aspect, the present disclosure describes a method for generating a current monitor signal. The method includes monitoring a current through a MOSFET using a driver IC. The method further includes measuring a thermal gradient across the driver IC to represent a temperature difference between the MOSFET and the driver IC. Finally the method includes generating a current monitor signal to represent the current through the MOSFET. The generating is based on the thermal gradient across the driver IC and is without knowledge of a temperature of the MOSFET.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other, and like reference numerals designate corresponding parts throughout the several views.

DETAILED DESCRIPTION

Figure 1:
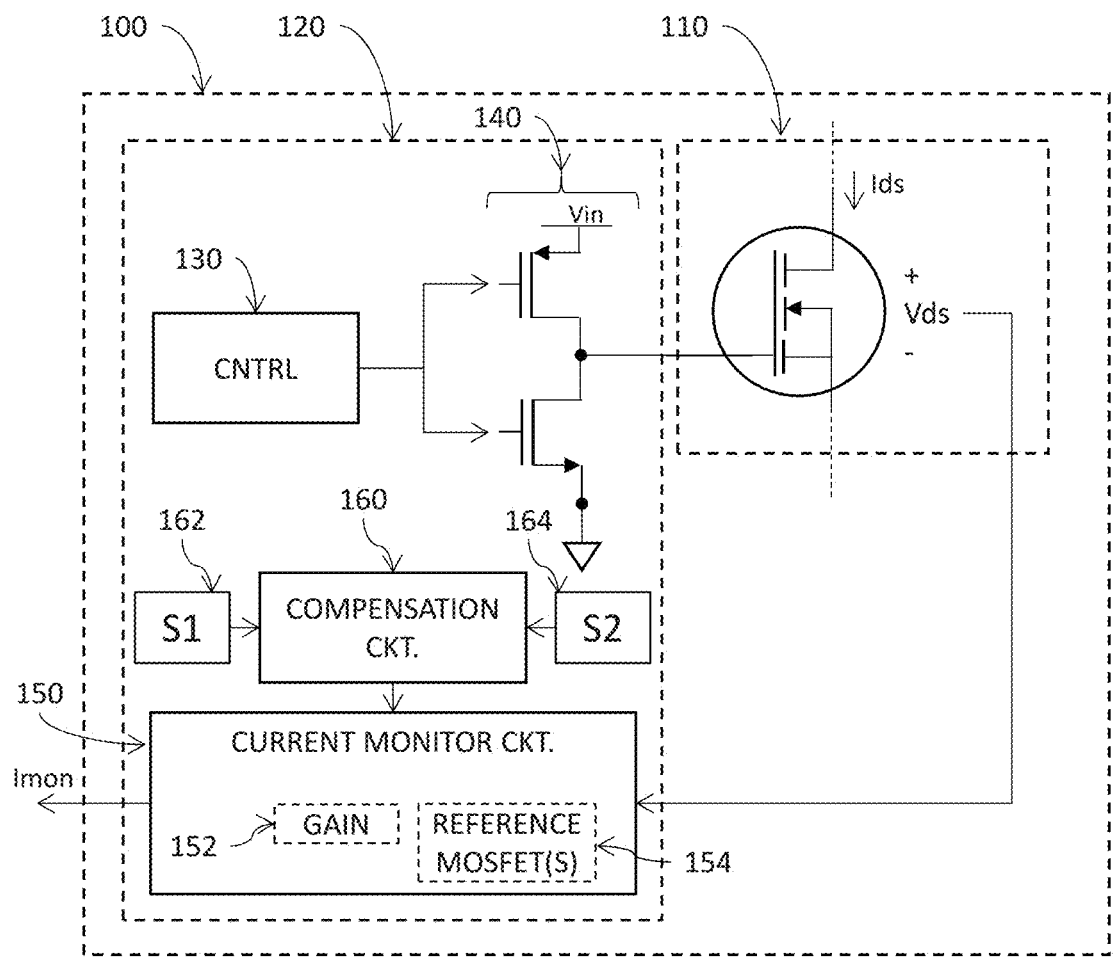
FIG. 1 schematically depicts a power stage according to an exemplary embodiment of the present disclosure.

The present disclosure embraces a power stage that provides power to a load. Additionally, the power stage includes circuitry (i.e., circuits, elements) to produce (e.g., output) a current monitor signal that represents the load on the power stage (e.g., the output current). The disclosed circuitry has the advantage of providing current monitor signal with improved accuracy, especially in high load conditions.

The power stage typically has a driver IC and at least one switching device (e.g., MOSFET, insulated-gate bipolar transistor (IGBT), junction field effect transistor (JFET), bipolar junction transistor (BJT), high-electron-mobility transistor (HEMT), etc.) for operation. Although many of the implementations described herein are directed to MOSFET devices, other devices can be used in addition to or instead of the MOSFET devices. The driver IC includes circuitry to drive the at least one switching device to operate in an ON-state (or an OFF-state). The driver IC may also include circuitry to monitor the at least one switching device and, based on this monitoring, generate a current monitor signal that represents the current through the at least one switching device.

For a power stage including a driver IC and a MOSFET (e.g., power MOSFET), the present disclosure recognizes that, during operation, the driver IC may operate at a different (e.g., lower) temperature than the MOSFET. In some implementations, the accuracy of the current monitor signal depends on this temperature difference between the driver IC and the MOSFET. In some implementations, the temperature difference (i.e., a thermal gradient between the driver IC and the MOSFET) corresponds to a temperature difference measured across the driver IC (i.e., a thermal gradient between locations on the driver IC).

Thus, an aspect of the present disclosure is related to measuring a thermal gradient across the driver IC and then using this thermal gradient to adjust how the current monitor signal is generated in order to maintain the accuracy of the current monitor signal for all load conditions (i.e., in different thermal conditions). An advantageous aspect of the disclosed circuits and method is that no direct temperature measurement of the MOSFET (or MOSFETs) is needed for this adjustment. In other words, the only temperatures that are measured are physically on or near the driver IC (and not on the MOSFET (e.g., temperature measurement is excluded from the MOSFET device)). In some implementations, a temperature measurement device may not be coupled to and/or within the footprint of the MOSFET (but can be coupled to and/or within the footprint of the driver IC). In some implementations, the temperature measurement can be performed on the driver IC, which is electrically coupled to and not thermally coupled to the MOSFET. This implies that the driver IC and the MOSFET may be physically distinct (e.g., on separate dies) and that the MOSFET circuitry may be simplified and/or standardized because the MOSFET does not requires any circuitry, coupling, or connections for determining its particular temperature. This advantageous aspect may correspond to savings in cost, size, and complexity for the power stage.

An exemplary power stage is illustrated in FIG. 1. The power stage 100 includes at least one metal-oxide semiconductor field-effect transistor (i.e., MOSFET) 110 that is suitable for conducting a current when turned to an ON state (i.e., switched-on) by a signal applied to a gate of the MOSFET. A driver IC 120 is used to switch the MOSFET on and off. To switch the MOSFET on/off, the driver IC 120 may include a controller 130 that provides a digital switching signal to a gate driver 140. The gate driver 140 typically includes an n-type metal oxide semiconductor (NMOS) transistor and a p-type metal oxide semiconductor (PMOS) transistor that are arranged as an inverter. Based on the configuration of the NMOS and PMOS, the gate driver 140 sources or sinks current to or from a gate of the MOSFET 110 (e.g., power MOSFET) to overcome the MOSFET's gate capacitance and switch the MOSFET 110 to an ON state or to an OFF state.

The driver IC 120 also includes a current monitor circuit 150 that monitors a drain-source current ($I_{DS}$) through the MOSFET 110 when the MOSFET is switched to an ON state. Because the MOSFET is typically coupled to the output of the power stage (not shown) the drain-source current ($I_{DS}$) of the MOSFET typically represents the output current ($I_{OUT}$) of the power stage. The power stage 100 also outputs a current monitor signal ($I_{MON}$), which is a current or voltage that corresponds to the current through the MOSFET.

The current monitor signal ($I_{MON}$) is provided by the current monitor circuit 150. For example, based on a drain-source voltage ($V_{DS}$) across the MOSFET 110 input to the current monitor circuit, the current monitor circuit 150 may output a current monitor signal ($I_{MON}$) that is proportional to a current ($I_{DS}$) through the MOSFET when the MOSFT is in the ON state. Measuring the voltage, $V_{DS}$, across the MOSFET prevents a direct measurement of the current through the MOSFET from interfering with the operation of the power stage (e.g., introduce losses). The current through the MOSFET ($I_{DS}$) may be derived from the voltage across the MOSFET ($V_{DS}$) and the resistance of the MOSFET ($R_{DS}$) (i.e., $V_{DS}=I_{DS} \cdot R_{DS}$).

The resistance, $R_{DS}$, of the MOSFET 110 varies with temperature. Accordingly, the current monitor circuit 150 may utilize one or more reference MOSFETs 154 to represent the operating characteristics of the MOSFET 110 for a range of temperatures. When the reference MOSFETs 154 in the current monitor circuit 150 are at the same temperature as the MOSFET 110 they have the same operating characteristics (e.g., resistance). Accordingly, the current monitor circuit 150 may be configured to apply $V_{DS}$ across one or more of the reference MOSFETs 154 to obtain a signal that is subsequently amplified by a gain stage (i.e., closed loop gain, gain) 152 in order to determine $I_{MON}$. In this way, $I_{MON}$ can remain accurate (e.g., relatively accurate) for a wide range of temperature conditions as long as the temperature of the MOSFET and the temperature of the reference MOSFET(s) remain close (e.g., within 10 degrees (deg) Celsius (C)). Determining the drain-source voltage, $V_{DS}$, of the MOSFET using one or more reference MOSFETs is one possible technique for generating $I_{MON}$. The scope of the disclosure is not limited to this particular technique, but rather embraces all circuits and techniques for generating $I_{MON}$ that are affected by a temperature difference between the driver IC and the MOSFET.

In some implementations, as a temperature difference between the reference MOSFETs 154 in the current monitor circuit 150 and the MOSFET 110 grows, $I_{MON}$ becomes a decreasingly accurate representation of the current through the MOSFET. In other words, when the temperature of the driver IC 120 is different from the temperature of the power MOSFET 110, then the current monitor signal ($I_{MON}$) includes an error caused by the temperature difference, and the magnitude of the error in the current monitor signal corresponds to the magnitude of the temperature difference. Thus by identifying the temperature difference between the driver IC and the MOSFET, the error in the current monitor signal may be quantified, eliminated, or otherwise compensated. Accordingly, the power stage 100 includes a compensation circuit 160.

In some implementations, the compensation circuit 160 receives a first measurement corresponding to a first temperature from a first sensor 162 (e.g., a series connection of biased diodes) located in a first location on the driver IC 120 and a second measurement corresponding to a second temperature from a second sensor 164 located in a second location on the driver IC 120. From these measurements, the compensation circuit determines a thermal gradient across the driver IC 120 as the difference between the first measurement and the second measurement. The current monitor receives this thermal gradient and the operation (e.g., gain) can be reconfigured based on this thermal gradient to provide a more accurate current monitor signal as a result.

In some implementations, an advantage of the disclosed techniques is that the current monitor circuit 150 can be adjusted to reduce or eliminate the error in the current monitor signal, $I_{MON}$, caused by this temperature difference. Another advantage of the disclosed techniques is that this adjustment (i.e., compensation) requires no direct temperature measurement of the power MOSFET 110. As will be discussed, the arrangement of the first and second sensors on the driver IC can be selected so that the measured thermal gradient across the driver IC is linearly related (proportional to) to the temperature difference between the MOSFET and the driver IC.

Figure 2A:
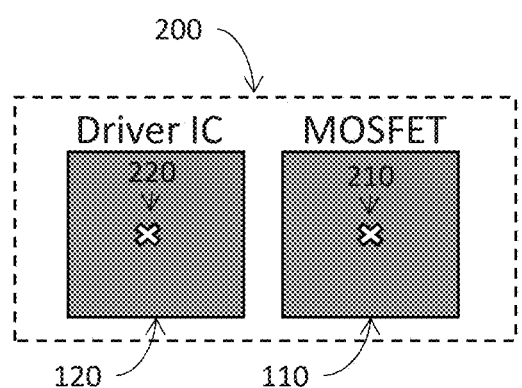
FIG. 2A graphically depicts a normal-load thermal condition of a power stage according to an embodiment of the present disclosure.

Two different thermal conditions for the power stage described above are illustrated FIGS. 2A and 2B. As shown, the power stage may include a driver IC 120 and a MOSFET 110. The elements are on separate dies but are included (e.g., contained) together in a package 200. FIG. 2A illustrates a normal load condition in which the temperature of both elements are approximately the same (i.e., isothermal). In this condition, there is no temperature difference between a thermal center 210 of the MOSFET 110 and a thermal center 220 of the driver IC 120. As described above, in this condition the current monitor circuit 150 (see FIG. 1) provides an accurate representation of the current through the MOSFET. Even if the temperature of the driver IC and the MOSFET change, $I_{MON}$ remains accurate as long as driver IC and the MOSFET are at approximately (e.g., <10 deg C.) the same temperature. Thus, for the thermal condition shown in FIG. 2A, any thermal gradient measurement provided by the compensation circuit 160 is small and has little effect on the current monitor circuit's generation of $I_{MON}$. This thermal condition can arise (e.g., typically arises) when the driver IC 120 and the MOSFET 110 are proximate (e.g., adjacent) to one another in same package 200 and the load condition on the MOSFET is low (e.g., the current and/or duty cycle of the MOSFET are not high in comparison to the suggested operating specifications of the MOSFET).

Figure 2B:
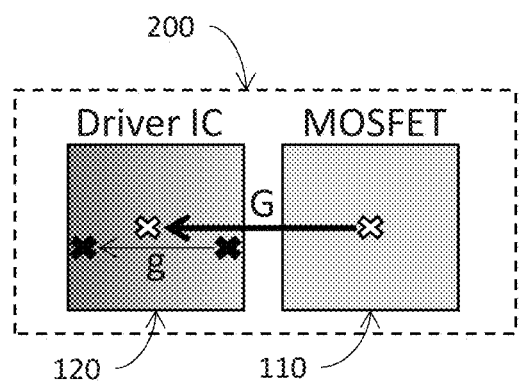
FIG. 2B graphically depicts a high-load thermal condition of a power stage according to an embodiment of the present disclosure.

FIG. 2B, on the other hand, illustrates a thermal condition in which the driver IC 120 and the MOSFET 110 are not at the same temperature (i.e., represented by the dissimilar shading). This thermal condition typically arises when the driver IC 120 and the MOSFET 110 are proximate to one another in same package 200 and the load condition on the MOSFET is high (e.g., the current and/or duty cycle of the MOSFET are high in comparison to the suggested operating specification of the MOSFET). In this condition, the temperature difference along a particular direction (i.e., a thermal gradient, G) between a thermal center 210 of the MOSFET 210 and a thermal center 220 of the driver IC 120 is non-zero.

Information about (e.g., knowledge of) the temperature difference between the MOSFET 110 and the driver IC 120 can be used to detect, reduce, correct, and/or compensate for the error. Information about (e.g., knowledge of) the temperature of the driver IC is insufficient to quantify the error based on a temperature difference and adding a temperature sensor to the MOSFET and coupling this sensor to the driver IC adds complexity, size, and cost to a power stage. Instead, the present disclosure suggests a technique to deduce this knowledge from temperatures on the driver IC alone.

As shown in FIG. 2B, the thermal gradient, G, between the MOSFET and the driver IC (die to die gradient) corresponds to a thermal gradient, g, across the driver IC. Thus, sensing the thermal gradient, g, across the driver IC can be used to detect, reduce, correct, and/or compensate for the error in the current monitor signal.

Figure 3:
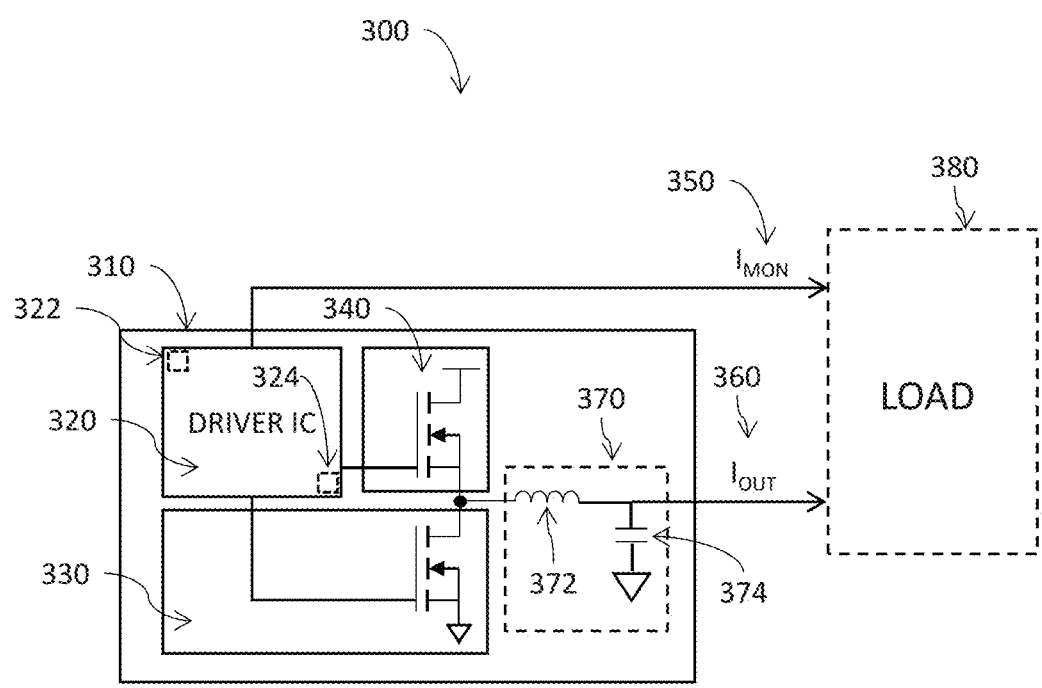
FIG. 3 is a block diagram that schematically depicts a switch-mode power converter system according to an embodiment of the present disclosure.

The principles, circuits, and techniques described thus far may be extended to more different (e.g., more complicated) embodiments. FIG. 3 illustrates a switch-mode power converter system 300 according to an embodiment of the present disclosure. As shown, the system may be a synchronous buck converter that has a driver IC 320 (e.g., based on the driver IC 120 in FIG. 1). The synchronous buck converter alternatively switches a MOSFET (i.e., a HS-FET) 340 to an ON state to connect the HS-FET 340 to a voltage source (e.g., $V_{IN}$) and a MOSFET (i.e., LS-FET) 330 to an ON state to connect the LS-FET 330 to a low voltage (e.g., ground). The synchronous buck converter also includes a storage circuit 370. The storage circuit may include an output inductor 372 and a capacitor 374 (or bank of capacitors) connected in a low pass configuration. The switching in the buck converter allows a storage circuit (e.g., filter) 370 connected to the output of the HS-FET and the LS-FET to charge and discharge according to a switching frequency to provide a regulated output current $I_{OUT}$ 360 to a load 380. The inductor (L) 372 and the capacitor (C) 374, which form an LC filter, may or may not be included with (e.g., within) the package 310.

The switch-mode power converter system 300 also outputs a current monitor signal, $I_{MON}$, 350 to represent $I_{OUT}$ 360. In some embodiments, the load 380 may receive $I_{MON}$ 350 as a diagnostic for additional processing and/or operations. For example, a load 380 embodied as a processor may compare $I_{MON}$ to a threshold in order to trigger cooling. Accordingly, $I_{MON}$ 350 should be an accurate (e.g., within +/−1 percent) representation of $I_{OUT}$ 360. The current monitor signal $I_{MON}$ may be a voltage or a current having an amplitude that is related to the $I_{OUT}$ (e.g., related linearly (e.g., proportional), related by a predetermined function, etc.).

The output current $I_{OUT}$ 360 corresponds to the current through the HS-FET 340 when the HS-FET is in the ON state and corresponds to the current through the LS-FET 330 when the LS-FET is in the ON state. Accordingly, the driver IC 320 includes a current monitor circuit 150, which in a possible embodiment, is coupled alternatively to the HS-FET and the LS-FET according to the switching frequency. As described previously, the current monitor circuit 150 can be configured to apply the drain-source voltage ($V_{DS}$) from the HS-FET (or LS-FET) to one or more reference MOSFETs 154 in order to create a signal that is amplified by a gain 152 to become $I_{MON}$. In an alternate embodiment, the current monitor circuit 150 is coupled to the LS-FET 330 without being coupled to the HS-FET 340. This approach may be useful when the duty cycle of the LS-FET 330 is higher than the HS-FET 340 (e.g., when the duty cycle of the HS-FET is small, e.g., <15%). In this case, the current monitor circuit 150 can generate $I_{MON}$ based on coupling $V_{DS}$ from the LS-FET 330 when the LS-FET is in the ON state. When the LS-FET is in the OFF state (i.e., the HS-FET is in the ON state), $I_{MON}$ can be generated algorithmically (e.g., estimated based on previous values of $I_{MON}$) instead of coupling $V_{DS}$ from the HS-FET.

The accuracy of $I_{MON}$ 350 resulting from this circuit operation is related to (e.g., proportional to) a temperature difference between the one or more reference MOSFETs in the driver IC and the HS-FET (or LS-FET). For example, when a temperature difference exists between the driver IC 320 and the HS-FET 340 and/or the LS-FET 330, then $I_{MON}$ includes an error based on this temperature difference.

Figure 4:
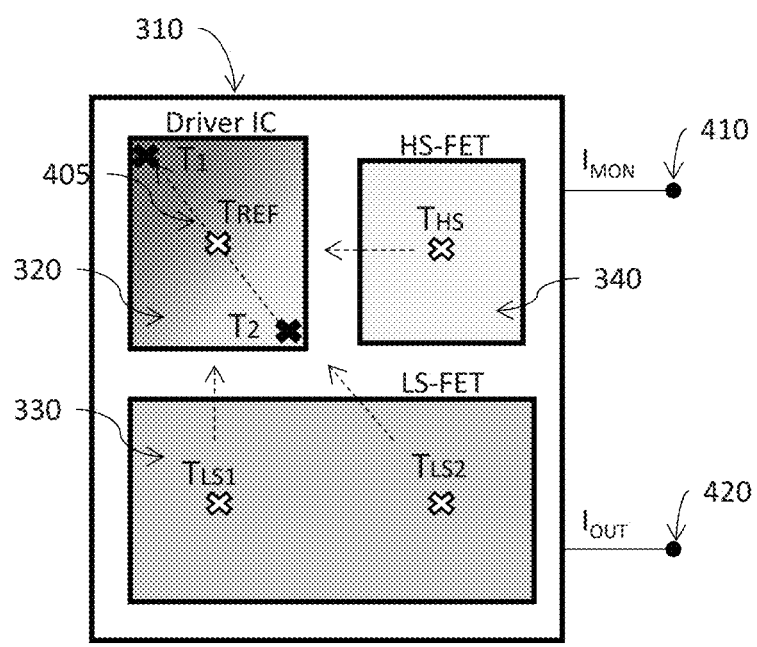
FIG. 4 graphically depicts thermal conditions within a package including elements of the switch-mode power converter system of FIG. 3.

The driver IC 320, the HS-FET 340, and the LS-FET 330 may each be fabricated on a separate die, and the separate dies may be arranged and contained in a package 310. A possible arrangement of the dies in the package is illustrated in FIG. 4. As shown, the arrangement of the dies within the package 310 may correspond to the relative size of each die. For example, a die of the LS-FET 330 is typically larger than a die of the HS-FET 340 because a duty cycle of the HS-FET 340 in operation (e.g., 15%) is typically less than the duty cycle of the LS-FET 330 in operation (e.g., 85%). In some embodiments the driver IC and the HS-FET are roughly half the size of the LS-FET. In these embodiments the dies can be arranged in a rectangular package with the driver IC in a left half of an upper portion of the package, the HS-FET in a right half of the upper portion of the package, and the LS-FET in a right and a left half of a lower portion of the package. The package 310 shown in FIG. 4 also includes a first pin 410 for coupling the current monitor ($I_{MON}$) out of the package and a second pin 420 for coupling the output current ($I_{OUT}$) out of the package.

The size difference between the HS-FET and the LS-FET may correspond to a temperature difference between the dies in a high load condition. The high load temperature condition is illustrated in FIG. 4. In the figure the die of the driver IC 320, a die of the LS-FET 330 and a die of the HS-FET 340 arranged (e.g., configured) in the package 310 are shaded according to their temperature (i.e., dark equals low temperature, light equals high temperature). As can be observed, the thermal center of the HS-FET is at a higher temperature ($T_{HS}$) than the LS-FET. Additionally, due to the size of the LS-FET, a temperature in a first portion $T_{LS1}$ may be different than a temperature in a second portion $T_{LS2}$. When $T_{HS}$ is higher than $T_{LS1}$ and $T_{LS2}$, a thermal gradient 405 ($T_2 > T_1$) across the driver IC is formed. In this condition, the temperature of the die of the driver IC 320 is highest in the corner located closest to the HS-FET 340 and the LS-FET 330 (i.e., at $T_2$), and the temperature of the die of the driver IC 320 is lowest in the corner located furthest from the HS-FET 340 and the LS-FET 330 (i.e., at $T_1$). Thus, as shown in FIG. 4, a thermal gradient 405 across the driver IC is maximum (e.g., approximately (e.g., +/−1 deg C.) maximum, substantially maximum) in a direction defined by these respective corners of the driver IC 320. In other words, the thermal gradient 405 across the driver IC 320 may be considered as having an amplitude/direction defined by a first temperature T1 at a first location that is furthest from the heat sources in the package and a second temperature T2 that is closest to the heat sources in the package. Said differently, the first location of the first sensor and the second location of the second sensor are based on relative positions of the HS-FET, the LS-FET, and the driver IC in the package.

Thermal characteristics and their relationship with the current monitor signal are described next with respect to the package embodiment of FIG. 4, which includes a package 310 with a driver IC 320, an HS-FET 340, and an LS-FET 330, but which does not include a storage circuit 370. The present disclosure, however, is not limited to this embodiment. The scope of the present disclosure covers other package embodiments regardless of the shape of the package, the arrangement of elements within the package, and/or the number/type of elements in the package. For example, a package may include elements arranged three-dimensionally. In another example, an element may be a heat sink instead of a heat source. In still another example, the driver IC may include more than two sensors to further distinguish the thermal conditions within the package.

Figure 5:
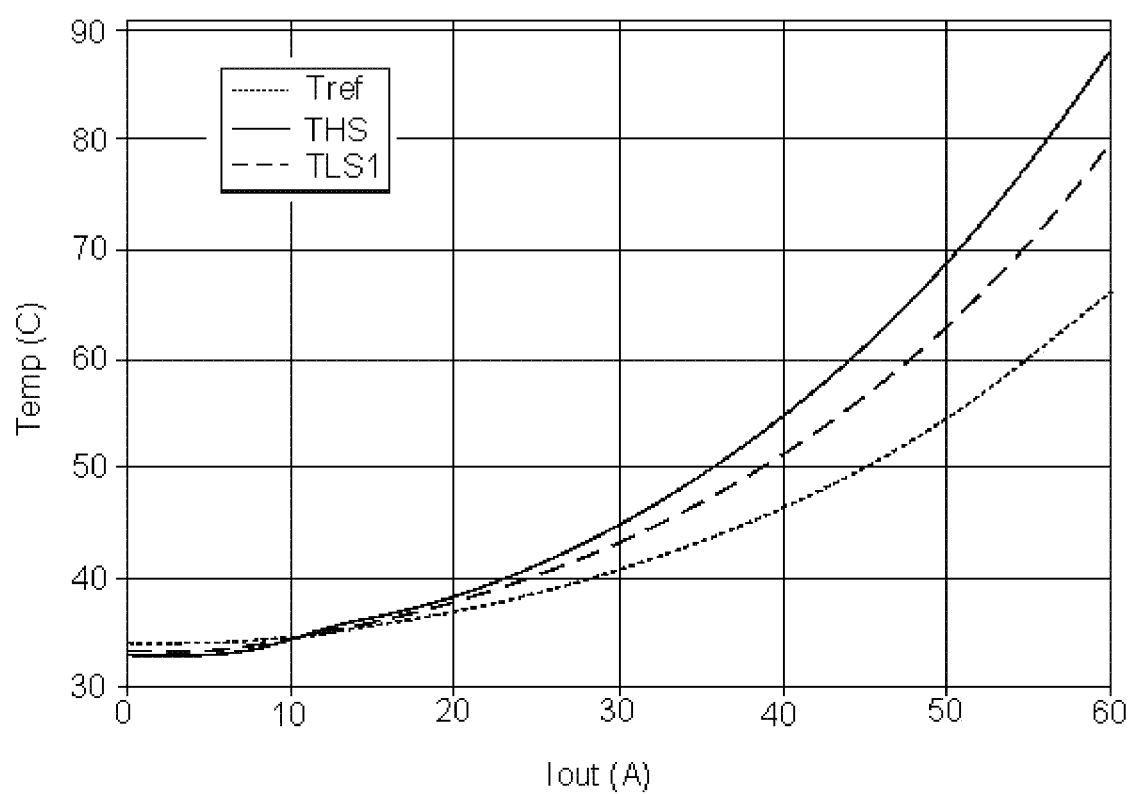
FIG. 5 is a plot of temperatures of the driver IC, the HS-FET, and the LS-FET at different output currents for an example embodiment of a switch-mode power converter system.

With regards to the package embodiment shown in FIG. 4, temperatures of the driver IC (i.e., $T_{REF}$), the HS-FET (i.e., $T_{HS}$) and the LS-FET (i.e., $T_{LS1}$) for different operating conditions (i.e., $I_{OUT}$) are plotted in FIG. 5. As shown, the difference between maximum and minimum temperatures between the dies increases as the load on the power converter system increases. For an output current ($I_{OUT}$) of 40 amps (A), the temperature different between the driver IC ($T_{REF}$) and the HS-FET ($T_H$S) is approximately 10 degrees (deg) Celsius (C) while at $I_{OUT}$ of 60A it is more than 20 deg. Thus, $T_{REF}$, by itself, is insufficient in predicting a temperature gradient between dies (i.e., an inter-die temperature difference).

Figure 6:
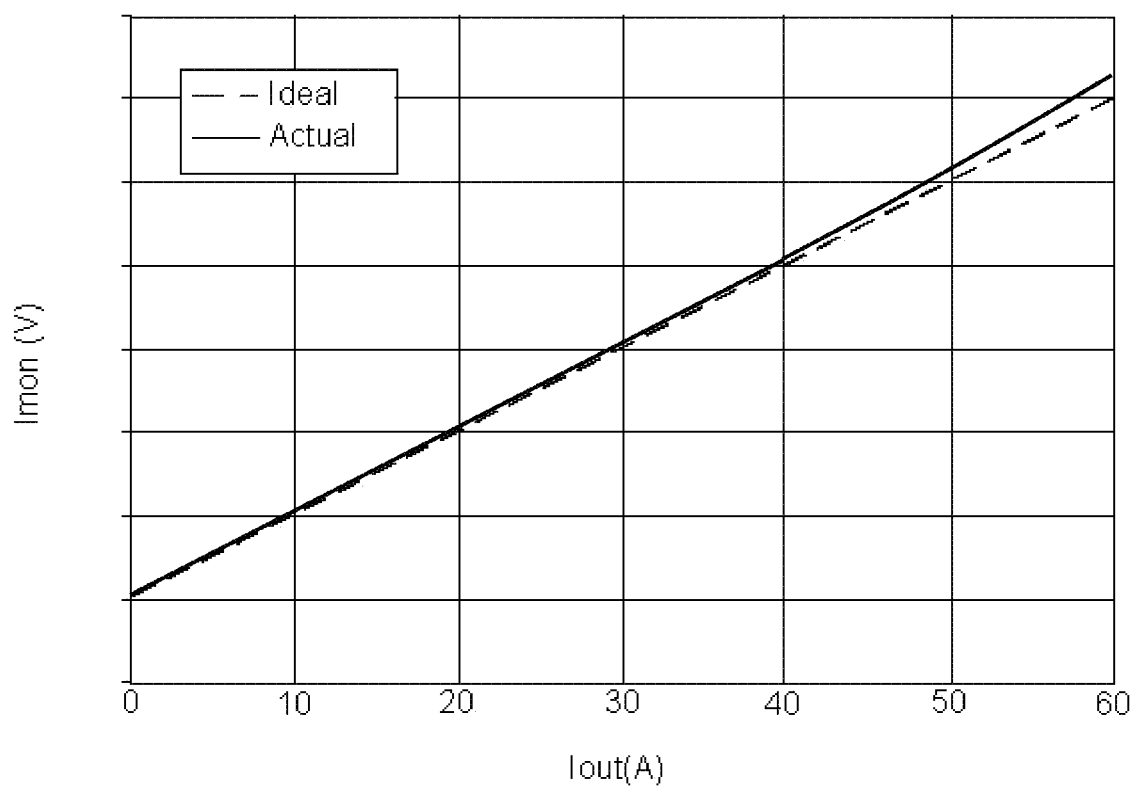
FIG. 6 is a plot of an actual current monitor signal compared to an ideal current monitor signal at different load conditions for an example embodiment of a switch-mode power converter system.

Also with regards to the package embodiment shown in FIG. 4, a current monitor signal, $I_{MON}$, at different load conditions (i.e., $I_{OUT}$) is illustrated in FIG. 6. In normal load conditions (e.g., $I_{OUT} < 40A$) in which the die-to-die temperature differences in the package are small (e.g., less than 10 deg C.), $I_{MON}$ is linearly related to $I_{OUT}$ (e.g., $I_{MON}$ (mV)=5(mV/A)·$I_{OUT}$ (A)). This linearity extends until the load condition reaches the high load conditions (e.g., $I_{OUT} > 40A$) where the temperatures of the HS-FET/LS-FET/driver IC start to deviate significantly (e.g., >10 degrees Celsius) from one another. In the high load condition, the current monitor signal $I_{MON}$ is generally higher than expected. Further, as the current increases further into high load conditions, the temperature gradient in the package increases and the accuracy of $I_{MON}$ diminishes.

Figure 7:
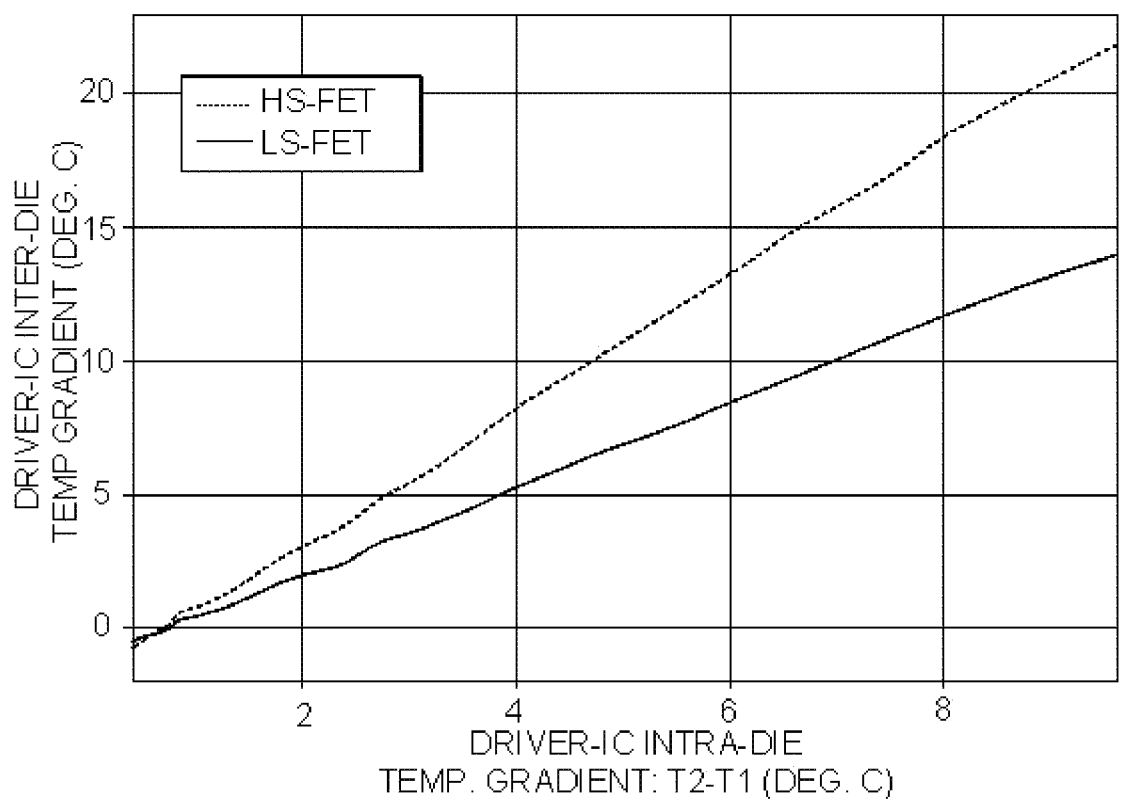
FIG. 7 is a plot of an inter-die thermal gradient versus an intra-die thermal gradient for an example embodiment of a switch-mode power converter system.

Also with regard to the package embodiment shown in FIG. 4, FIG. 7 illustrates thermal gradient relationships. As shown in FIG. 7, the intra-die gradient across the driver IC (i.e., $T_2 - T_1$) is linearly related to the inter-die thermal gradient between the driver IC and the HS-FET (i.e., $T_{HS} - T_{REF}$) or the between the driver IC and the thermal center of the LS-FET (i.e., $T_{LS} - T_{REF}$). Thus, the temperature gradient across the driver IC (i.e., $T_2 - T_1$) may be used to represent the temperature difference between the HS-FET and the driver IC and/or the temperature difference between the LS-FET and the driver IC. Moreover, errors in a current monitor signal that are caused by inter-die thermal gradients (i.e., $T_{HS} - T_{REF}$ or $T_{LS} - T_{REF}$) may be detected and corrected for by measuring the intra-die gradient (i.e., $T_2 - T_1$).

Generating a current monitor signal that is corrected for errors due to thermal gradients may be achieved in a variety of ways. For example, the circuitry generating $I_{MON}$ may be configured to detect a thermal gradient, compare the thermal gradient to a threshold, and then react to thermal gradients exceeding the threshold by adjusting $I_{MON}$. Alternatively, the circuitry generating $I_{MON}$ may be configured to account for a thermal gradient at all times, even when no significant thermal gradient is present.

Figure 8:
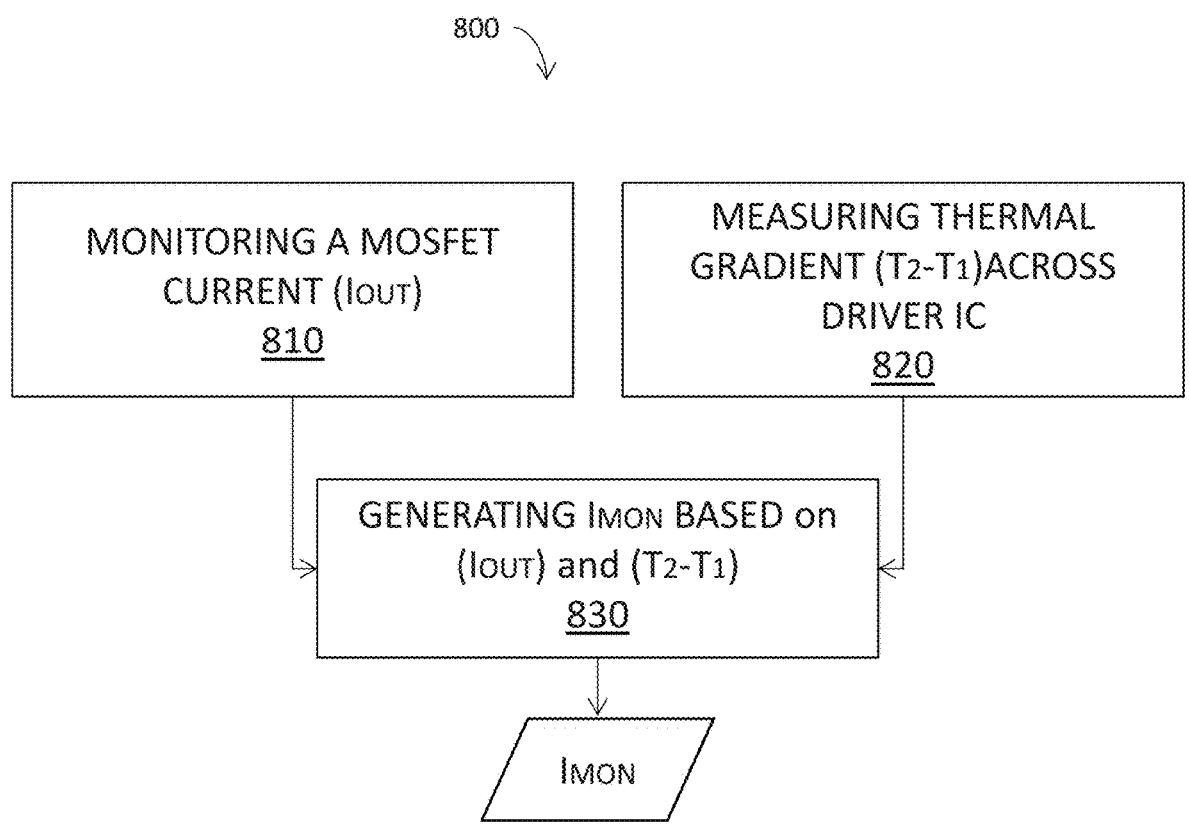
FIG. 8 is a flow chart of a method for generating a current monitor signal in a power converter according to an embodiment of the present disclosure.

One possible embodiment of a method for generating a current monitor signal ($I_{MON}$) is shown in FIG. 8. In the method 800, a current through a MOSFET is monitored 810. The current may be monitored through a direct measurement or an indirect measurement. For example, the current through the MOSFET (e.g., $I_{OUT}$) may be deduced through a measurement of a voltage ($V_{DS}$) across the MOSFET. Additionally, a thermal gradient ($T_2 - T_1$) across the driver IC is measured 820 to represent a temperature different between the MOSFET and the driver IC. Finally, a current monitor signal $I_{MON}$ is generated 830 based on the current (e.g., $I_{OUT}$) and based on the thermal gradient (i.e., $T_2 - T_1$).

In one possible embodiment, the current monitor circuit may utilize a gain that is a function of the determined thermal gradient to reduce the error. For example, a current monitor signal may be expressed as:

$$I_{MON} = I_{OUT} \cdot (K_1 - K_2(T_2 - T_1)),$$

where $K_1$ and $K_2$ are constants that may be adjusted based on the particular embodiment and operating characteristics. $T_1$ is a first temperature at a first location 322 of the driver IC 320 and $T_2$ is a second temperature at a second location 324 on the driver IC 320. Thus, when there is no thermal gradient across the driver IC then $I_{MON}$ is proportional to $I_{OUT}$ (see FIG. 6). As the thermal gradient grows, the proportionality constant $K_1$ (i.e., the gain) is reduced by $K_2(T_2 - T_1)$ to prevent over estimating the current monitor signal and to align the current monitor signal with the ideal curve, as shown in FIG. 6.

The above generation of $I_{MON}$ by adjusting a gain of a current monitor circuit is presented by way of example. The scope of the present disclosure includes any adjustment of the current monitor circuit based on the thermal gradient to reduce error in (i.e., increase accuracy of) the current monitor signal. For example in another possible embodiment, an error in the current monitor signal may be computed based on the temperature gradient across the driver. Once computed this error may be subtracted from the uncorrected current monitor signal to increase its accuracy.

In general, those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation, and all technical and scientific terms used herein have the same meaning as commonly understood by one of ordinary skill in the art.

The invention claimed is:

1. A power stage comprising:
  a metal-oxide semiconductor field-effect transistors (MOSFET); and
  a driver integrated circuit (IC) coupled the MOSFET and configured to switch the MOSFET to an ON-state, wherein the driver IC includes:
    a current monitor circuit that produces a current monitor signal corresponding to a current through the MOSFET when the MOSFET is in the ON-state, the current monitor signal including an error caused by a temperature difference between the MOSFET and the driver IC; and
    a compensation circuit configured to measure a thermal gradient across the driver IC and, based on the thermal gradient, adjust the current monitor circuit to reduce the error in the current monitor signal.

2. The power stage according to claim 1, wherein the current through the MOSFET corresponds to an output current of the power stage.

3. The power stage according to claim 1, wherein the compensation circuit receives no direct temperature measurement of the MOSFET.

4. The power stage according to claim 1, wherein the current monitor circuit receives a drain source voltage ($V_{DS}$) across the MOSFET at an input of the current monitor circuit.

5. The power stage according to claim 1, wherein the current monitor signal has an amplitude that corresponds to a gain of the current monitor circuit.

6. The power stage according to claim 5, wherein the gain of the current monitor circuit is based on the thermal gradient across the driver IC to adjust the current monitor circuit to reduce the error in the current monitor signal.

7. The power stage according to claim 1, wherein the compensation circuit is coupled to a first sensor located at a first location on the driver IC and to a second sensor located at a second location on the driver IC, the compensation circuit configured to measure the thermal gradient across the driver IC based on a difference between a first measurement by the first sensor and a second measurement by the second sensor.

8. The power stage according to claim 7, wherein the first location and the second location are aligned substantially along a direction in which the thermal gradient across the driver IC is approximately maximum.

9. The power stage according to claim 7, wherein, based on the first location and the second location, the thermal gradient across the driver IC is linearly related to the temperature difference between the MOSFET and the driver IC.

10. A switch-mode power converter system comprising:
  a high-side metal-oxide semiconductor field-effect transistor (HS-FET);
  a low-side metal-oxide semiconductor field-effect transistor (LS-FET); and
  a driver IC configured to drive the HS-FET and the LS-FET to alternately conduct an output current, the driver IC further configured to measure a thermal gradient across the driver IC, and to output a current monitor signal that represents the output current and that depends on the thermal gradient across the driver IC, the HS-FET, the LS-FET, and the driver IC being included in a package.

11. The switch-mode power converter system according to claim 10, wherein the HS-FET, the LS-FET, and the driver IC are each on a separate die within the package.

12. The switch-mode power converter system according to claim 10, wherein the thermal gradient across the driver IC is based on a first measurement by a first sensor at a first location on a die of the driver IC and a second measurement by a second sensor located at a second location on the die of the driver IC.

13. The switch-mode power converter system according to claim 12, wherein the first location and the second location are based on relative positions of the HS-FET, LS-FET, and the driver IC in the package.

14. The switch-mode power converter system according to claim 10, wherein the current monitor signal output by the driver IC is based on a gain and the adjustment of the current monitor signal includes adjusting the gain based on the thermal gradient across the driver IC.

15. The switch-mode power converter system according to claim 10, wherein the thermal gradient across the driver IC is proportional to a thermal gradient across the package.

16. The switch-mode power converter system according to claim 10, wherein the package includes a first pin for the output current and a second pin for the current monitor signal.

17. The switch-mode power converter system power system according to claim 10, further comprising a load that receives the output current for power and that receives the current monitor signal for diagnostics.

18. A method for generating a current monitor signal, the method comprising:
    monitoring a current through a metal-oxide field-effect transistor (MOSFET) using a driver integrated circuit (driver IC);
    measuring a thermal gradient across the driver IC to represent a temperature difference between the MOSFET and the driver IC; and
    generating a current monitor signal to represent the current through the MOSFET wherein the generating is based on the thermal gradient across the driver IC and is without a measurement of a temperature of the MOSFET.

19. The method for generating a current monitor signal according to claim 18, wherein the MOSFET and the driver IC are both included in a package.

20. The method for generating a current monitor signal according to claim 19, wherein the measuring a thermal gradient across the driver IC comprises sensing a first temperature at a first location on a die of the driver IC and sensing a second temperature at a second location on the die of the driver IC, and wherein the first location and the second location are based on relative positions of a die of the MOSFET and the die of driver IC in the package.

* * * * *